(12) United States Patent
Bandaru et al.

(10) Patent No.: US 11,418,024 B2
(45) Date of Patent: Aug. 16, 2022

(54) ELECTROSTATIC DISCHARGE CIRCUIT USING BOOSTER CELL

(71) Applicant: WESTERN DIGITAL TECHNOLOGIES, INC., San Jose, CA (US)

(72) Inventors: Rajeswara Rao Bandaru, Karnataka (IN); Gopikrishna Siddula, Karnataka (IN); Seema Jain, Karnataka (IN)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 11 days.

(21) Appl. No.: 16/896,615

(22) Filed: Jun. 9, 2020

(65) Prior Publication Data
US 2021/0384723 A1    Dec. 9, 2021

(51) Int. Cl.
*H02H 9/04* (2006.01)
*H01L 27/02* (2006.01)

(52) U.S. Cl.
CPC ......... *H02H 9/046* (2013.01); *H01L 27/0255* (2013.01); *H01L 27/0292* (2013.01)

(58) Field of Classification Search
CPC ............. H01L 27/0248; H01L 27/0255; H01L 27/0292; H02H 9/046
USPC .......................................................... 361/56
See application file for complete search history.

(56) References Cited

U.S. PATENT DOCUMENTS

| | | | | |
|---|---|---|---|---|
| 4,806,999 A * | 2/1989 | Strauss | ............... | H01L 27/0255 257/357 |
| 5,946,176 A * | 8/1999 | Ghoshal | ............. | H01H 59/0009 361/111 |
| 6,028,465 A * | 2/2000 | So | ........................ | H01L 27/0251 327/321 |
| 6,144,542 A * | 11/2000 | Ker | ..................... | H01L 27/0251 361/111 |
| 6,327,126 B1 * | 12/2001 | Miller | ................. | H01L 27/0251 361/56 |
| 6,624,998 B2 * | 9/2003 | May | ..................... | H01L 27/0255 361/111 |
| 6,925,627 B1 * | 8/2005 | Longway | .............. | G06F 30/394 257/207 |
| 7,777,998 B2 * | 8/2010 | Stockinger | .......... | H01L 27/0292 361/56 |
| 7,907,373 B2 * | 3/2011 | Jeon | ..................... | H01L 27/0266 361/56 |
| 10,134,728 B2 | 11/2018 | Mathur et al. | | |
| 2007/0091522 A1 * | 4/2007 | Chen | ................... | H01L 27/0292 361/56 |
| 2012/0268848 A1 * | 10/2012 | Lin | ........................ | H02H 9/046 361/56 |

(Continued)

Primary Examiner — Thienvu V Tran
Assistant Examiner — Sreeya Sreevatsa
(74) Attorney, Agent, or Firm — ArentFox Schiff LLP (57) ABSTRACT

An electrostatic discharge (ESD) circuit including a booster cell is disclosed. The ESD circuit may include first and second rails configured to provide power to the ESD circuit. The first rail may include two spaced apart conductors. The ESD circuit may further include an input/output (I/O) pad and a power/ground (P/G) pad. The P/G pad may include a power clamp electrically coupled between the first and second rails. The booster cell may be physically located between the I/O pad and the P/G pad. The booster cell may provide an electrical connection between the two spaced apart conductors.

2 Claims, 8 Drawing Sheets

(56) References Cited

U.S. PATENT DOCUMENTS

| | | | |
|---|---|---|---|
| 2013/0063843 A1* | 3/2013 | Chen | H01L 23/552 |
| | | | 361/56 |
| 2017/0255741 A1* | 9/2017 | Sharma | H01L 27/0248 |
| 2020/0153241 A1* | 5/2020 | Mathur | H02H 9/046 |
| 2021/0193647 A1* | 6/2021 | Ma | H01L 27/0688 |

* cited by examiner

FIG. 7 understood.

ELECTROSTATIC DISCHARGE CIRCUIT USING BOOSTER CELL

BACKGROUND

Field

This disclosure is generally related to electronic devices, and more particularly to integrated circuits.

Background

Integrated circuits (ICs) are ubiquitous in society today. ICs are used in numerous digital and analog electronics applications ranging from everyday consumer applications (e.g., wireless technologies, storage technologies, computers, appliances, etc.) to high-grade military applications, and beyond.

Storage devices enable users to store and retrieve data. Storage device manufacturers use ICs for implementing state-of-the-art memory technologies. These functions may include processing functions and high speed-data storage, for example. Storage devices may include non-volatile memory devices. An example of a non-volatile memory is flash memory, which may include array(s) of NAND cells on one or more dies. Flash memory may be found in solid-state devices (SSDs), Secure Digital (SD) cards and similar IC-based components.

A die in communication with a controller IC may include core processing circuitry formed on the die's interior surface, and a pad ring including multiple input/output (I/O) pads positioned around the die's perimeter. The pad ring may also include distributed power-ground (P/G) pads for supplying power or ground paths via respective P/G rails to the IC circuits. I/O pads include input and output paths to and from the core processing components to send and receive data to external components.

Care must be taken in handling ICs or inadvertently exposing them to electro-static discharge (ESD) events. ESD is a rapid transfer of charge between two electrically charged objects, often caused by direct contact, a short circuit, improper grounding, a dielectric breakdown, and the like. Because the I/O pads are coupled to the internal circuits, they are vulnerable to passing along ESDs that can produce breakdown voltages. IC manufacturers have developed techniques to reduce the damaging effects of ESD by providing a low resistance discharge path to avoid exceeding this breakdown voltage and damaging the IC. Current such techniques, however, fall short of effectively mitigating the adverse effects of ESD phenomena in modern ICs.

SUMMARY

One aspect of an electrostatic discharge (ESD) circuit is disclosed herein. The ESD circuit includes first and second rails configured to provide power to the ESD circuit. The first rail includes two spaced apart conductors. The ESD circuit further includes an input/output pad, and a power/ground (P/G) pad. The P/G pad includes a power clamp electrically coupled between the first and second rails. The ESD circuit further includes a booster cell physically located between the I/O pad and the P/G pad. The booster cell provides an electrical connection between the two spaced apart conductors.

Another aspect of an electrostatic discharge (ESD) circuit is disclosed herein. The ESD circuit includes first and second rails configured to provide power to the ESD circuit. The first rail includes two spaced apart conductors. The ESD circuit further includes a power/ground (P/G) pad including a power clamp electrically coupled between the first and second rails. The ESD circuit also includes a booster cell physically located outside the P/G/pad. The booster cell provides an electrical connection between the two spaced apart conductors.

Another aspect of an electrostatic discharge (ESD) circuit is disclosed herein. The ESD circuit includes first and second rails configured to provide power to the ESD circuit. The first rail includes two spaced-apart conductors. The ESD circuit further includes a power/ground (P/G) pad having a width. The P/G pad includes a power clamp electrically coupled between the first and second rails. The ESD circuit further includes a booster cell. The booster cell provides an electrical connection between the two spaced apart conductors. The booster cell has a width less than the width of the P/G pad.

It is understood that other aspects of the storage device will become readily apparent to those skilled in the art from the following detailed description, wherein various aspects of apparatuses and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of the present invention will now be presented in the detailed description by way of example, and not by way of limitation, with reference to the accompanying drawings, wherein.

It is understood that other aspects of the ESD circuits will become readily apparent to those skilled in the art from the following detailed description, wherein various aspects of apparatuses and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

DETAILED DESCRIPTION

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The words "exemplary" and "example" are used herein to mean serving as an example, instance, or illustration. Any exemplary embodiment described herein as "exemplary" is not necessarily to be construed as preferred or advantageous over other exemplary embodiments. Likewise, the term "exemplary embodiment" of an apparatus, method or article of manufacture does not require that all exemplary embodiments of the invention include the described components, structure, features, functionality, processes, advantages, benefits, or modes of operation.

As used herein, the term "coupled" is used to indicate either a direct connection between two components or, where appropriate, an indirect connection to one another through intervening or intermediate components. In contrast, when a component referred to as being "directly coupled" to another component, there are no intervening elements present.

In the following detailed description, various aspects of ESD circuits will be presented. These aspects are well suited for ICs used in flash storage devices, such as SSDs and SD cards which include NAND cells to store data. These aspects may also be extended to, and equally suitable for, ICs used in all types of devices capable of storing data, for example, integrated circuits (ICs) that include dynamic random access memory (DRAM), field programmable gate arrays (FPGAs), controllers, etc. In addition, it will be appreciated by those skilled in the art that the principles of this disclosure are not limited to storage devices. Rather, the ESD circuits as described herein may be used to address ESD phenomena in any die or IC, such as without limitation microprocessors, digital signal processors (DSPs), wireless transceiver ICs, analog ICs, field programmable gate arrays and any other type of digital or analog IC subject to damage from ESD discharge.

For example, the principles herein can also be applicable to system on a chip (SoC)-based ICs. A system on a chip (SoC) is a single integrated circuit that includes a combination of the electronic circuits of different computer components onto a single IC. Thus, for example, a SoC can include a complete die with a single substrate that contains each of the required analog, digital, mixed-signal, or radio frequency functions, as applicable, onto the IC. In some implementations involving microprocessor technologies, the SoC may be configured with multiple processor cores. In other embodiments involving storage devices, the different functions including the storage and controller technologies may be integrated into a single SoC design. SoC devices often include significant number of circuit elements occupying the die. As such, the die real estate may become a major constraint, and regions on the die for pad placement in these core-limited SoC designs are circumscribed. These factors may leave the designer with limited flexibility to change the pad area or increase the pin count, for instance. These practical limitations relating to the allocated I/O pad regions in SOCs and other core-limited IC designs place further obstacles on the manufacturer to design effective ESD circuits configured to protect the IC from damage due to sudden discharges. Furthermore, in current IC designs, a significant amount of I/O circuitry may populate the I/O pads (e.g., transmitters, receivers, comparators, etc.) These circuits may use both die area and different metals for routing the circuit elements, leaving fewer resources for the manufacturer to allocate for ESD purposes.

It will be appreciated by those skilled in the art that, during manufacturing, assembly, and testing of an IC, ESD events may occur due to (among other causes) human contact with the I/O pads or pins. This contact may cause a relatively high current to flow in the die of the IC. In many cases without protective procedures in place, the current can be sufficient to damage the internal circuitry on the die, resulting in device failure. For this reason, industry standards organizations (like JEDEC) or the manufacturer may promulgate standards specifying certain minimum ESD requirements relating to a particular dies or ICs, or classes of ICs, to protect the ICs from ESD-induced failures.

Figure 4:
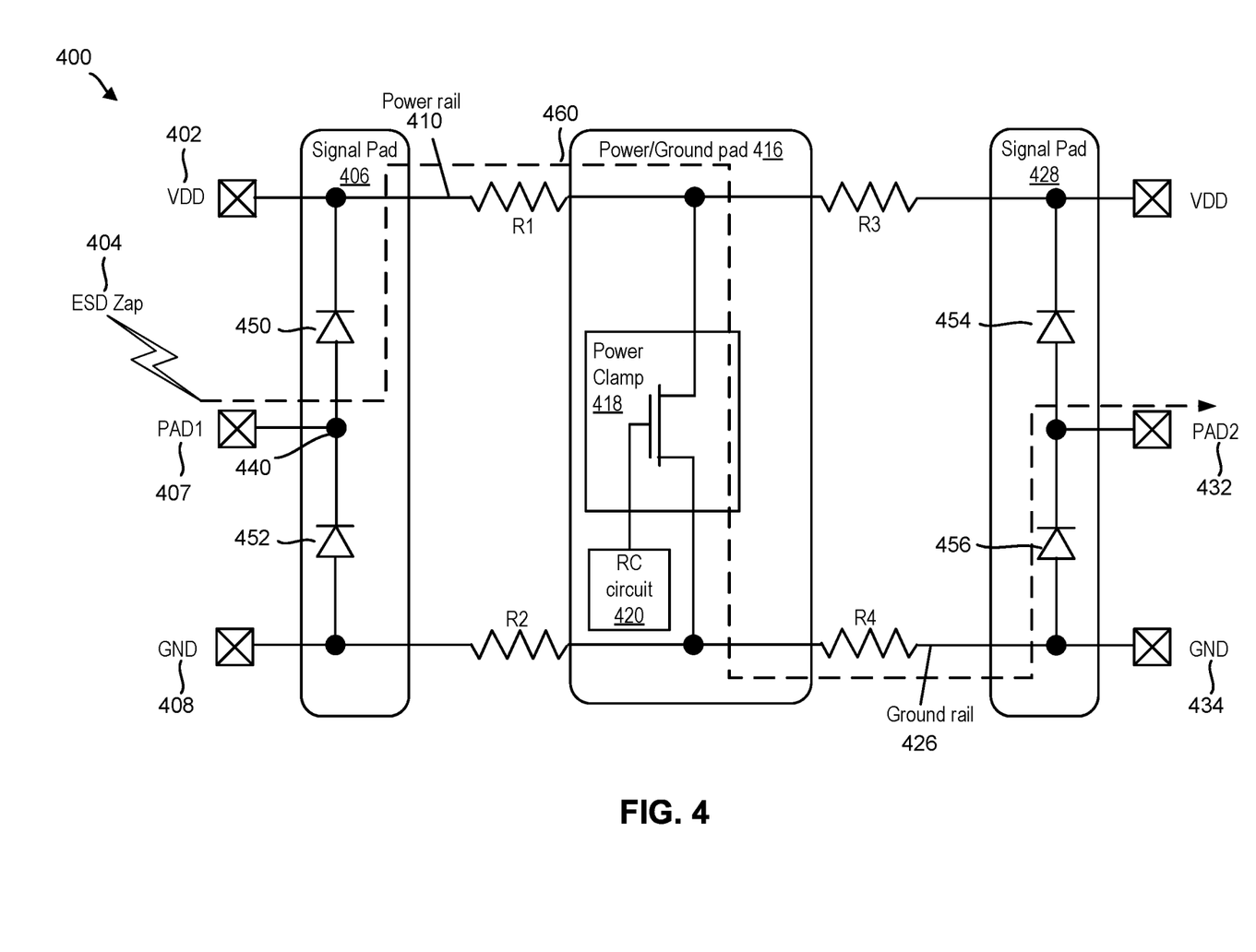
FIG. 4 is a block diagram illustrating an example of an ESD circuit for protecting an IC from an ESD-induced voltage using steering diodes and a power clamp.

For example, the manufacturer may implement an ESD protection circuit that is operable to neutralize ESD events without damaging the IC. When human contact or another event induces an ESD transient, the ESD protection circuit can pass the current from a dedicated input signal pin or pad and steer the current through one or more VDD (or VSS) rails and through a power clamp circuit (e.g., a power MOSFET) located at a P/G pad to a dedicated output pin (FIG. 4). To properly facilitate this procedure, one or more steering diodes may be incorporated into the signal path at or near the input signal pad or pin. In short, by routing the charge through a dedicated path, damage to the core IC circuit components can in principle be avoided.

A common problem that may compromise this procedure is that the VDD/VSS rails through which the ESD-based current travels have a finite resistance. The values of this resistance increase as the dedicated input pad and associated ESD diode are positioned farther from the P/G pad. That is to say, the current path in the VDD/VSS rails becomes longer as the P/G pad is positioned farther away from the I/O pad receiving the ESD discharge. A longer current path results in a higher overall resistance on the rails, and consequently a higher voltage drop in the pad ring. Where this higher voltage exceeds a device breakdown voltage, the ESD event can damage the IC.

Accordingly, the VDD/VSS rails should be configured such that the resistance is at a minimum value. While this value may vary depending on the applicable industry standard, the fabrication technology, process variations and other factors, the resistance on the rails between the I/O and P/G pads should generally be no more than approximately 0.5-1 ohm. However, in certain IC applications such as an SoC architecture, the core circuitry may occupy a significant amount of space, meaning that the I/O pad network can be relegated to a comparatively small area, thereby limiting design flexibility. For example, the overall height of the I/O pads in the ring may be made smaller to accommodate the core circuitry in a core-limited SoC design or in any other circuit implementation in which I/O pad area is constrained to a small value. Common such ICs include microprocessors and microcontrollers, and other SoCs and ICs incorporating intensive amounts of digital circuit components.

Figure 5:
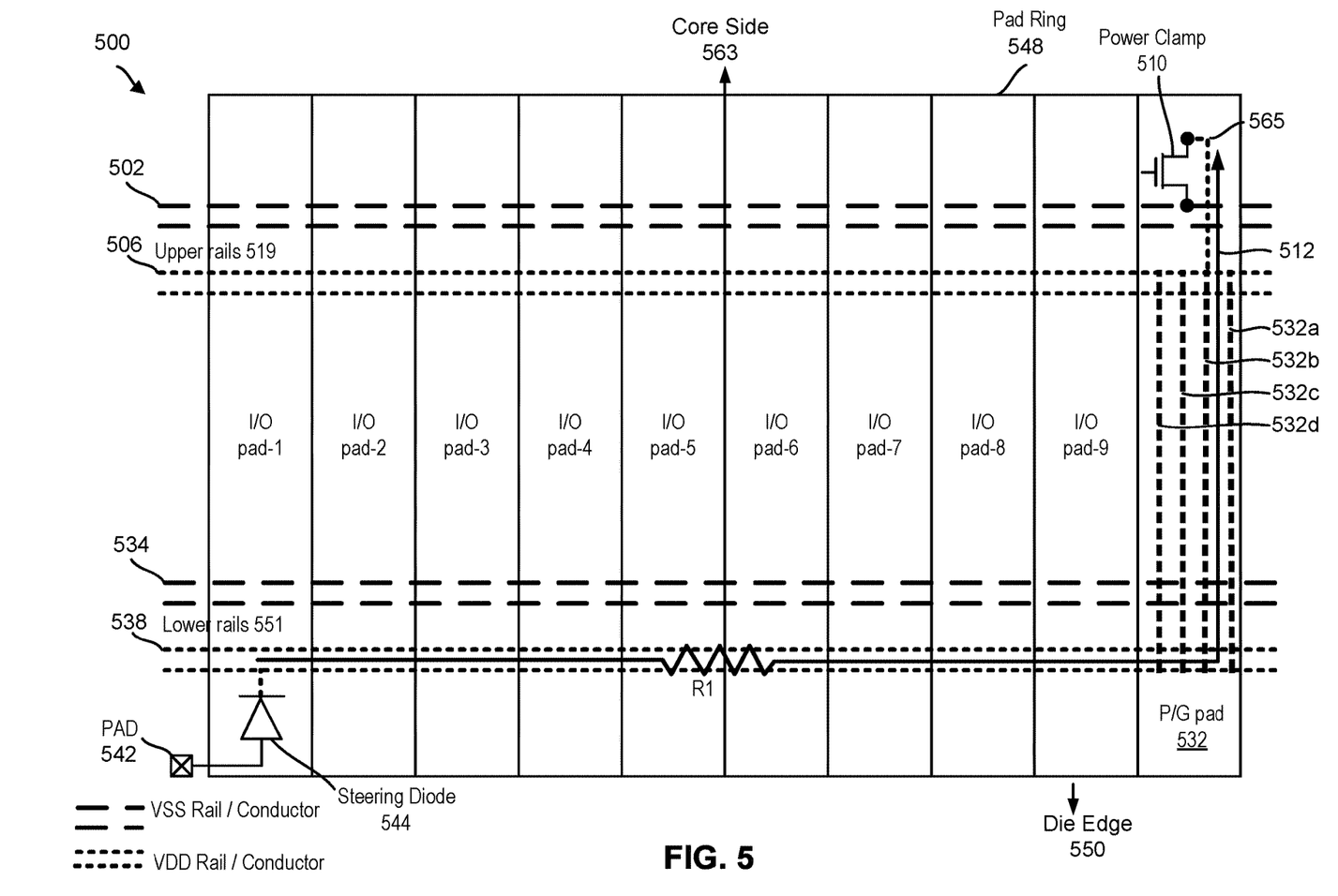
FIG. 5 is a diagram illustrating an example of an ESD circuit implemented on an I/O pad ring adjacent a die edge.

The reduced area of the I/O pad ring in an IC is one factor that places practical limitations on the minimum achievable resistance of the rails. In particular, the maximum number of possible VDD/VSS rails is limited by the corresponding height limitations of the I/O pads (FIG. 5). Particularly where the ESD input pad is distant from the clamp at the P/G pad, the high resistance of the rails can contribute to a greater number of IC failures due to ESD events.

Accordingly, in one aspect of the disclosure, an ESD circuit incorporates a booster cell to reduce the net resistance of the rails. The ESD circuit in one embodiment may include VDD rails and VSS rails configured to provide power to the ESD circuit. In one embodiment, the VDD rails include a plurality of spaced apart conductors that extend at least in part across a network of I/O pads. The VSS rails may also include a plurality of spaced apart conductors that extend at least in part across the I/O pad network. In many embodiments, both VDD and VSS rails are spaced apart and configured in this or a similar manner. Each of VDD and VSS may include a plurality of conductors, but the number of conductors is typically limited by the area/height constraints on the pad ring. In one embodiment, two conductors each are used to implement the VDD and VSS rails.

The ESD circuit may also include an I/O pad, and a P/G pad physically located at some distance from the I/O pad. In one embodiment, the I/O pad associated with the ESD circuit includes one or more steering diodes coupled to the VDD (or VSS) rail. For example, the ESD circuit may include one steering diode coupled between the input of the I/O pad and VDD, and another steering diode coupled between the input of the I/O pad and VSS (e.g., ground). The ESD circuit may further include a power clamp electrically coupled between the VDD and VSS rails. The power clamp may, for example, be a power MOSFET transistor having a resistor-capacitor (RC) circuit for properly configuring a gate voltage of the transistor to receive the discharge current.

The booster cell of the ESD circuit may be physically located between the I/O pad of the ESD circuit and the P/G pad. The booster cell may provide an electrical connection (or a plurality of such connections) between the spaced apart conductors associated with the VDD rails. In other embodiments, the booster cell may be configured to provide an electrical connection between the spaced apart conductors associated with the VSS rails. In still other embodiments, the booster cell may be configured such that an electrical connection is provided between the VDD rails, and another electrical connection is provided between the VSS rails.

The electrical connection by the booster cell (e.g., between the VDD rails) may be used in the current path of an ESD discharge to reduce the overall resistance of the rails. In some embodiments, the booster cell may be placed adjacent the I/O pad of the ESD circuit. Thus, a plurality of I/O pads may separate the I/O pad from the P/G pad. The booster cell may operate to short-circuit the upper and lower VDD conductors at a physical location immediately adjacent the I/O pad with the ESD circuit, to maximize the possible reduction in resistance. In other embodiments, the booster cell may also operate to short-circuit the upper and lower VSS conductors, e.g., when a second steering diode located at the I/O pad is coupled between the I/O pad input and VSS (e.g., FIG. 6B). In these embodiments, the electrical connection provided by the booster cell may include multiple electrical connections, either stacked or placed side by side, for shorting VDD conductors together and for shorting VSS conductors together.

As but one of numerous benefits of these configurations, the ESD circuit with the booster cell may operate to reduce the resistance (and thereby increase the effectiveness of the ESD circuit in protecting against ESDs) without affecting the overall geometry of the I/O pad network. Thus, the ESD circuit may be substantially improved (as described below) even in core-limited SoC designs or other configurations where core circuit components and die real estate dictate the achievable area of the I/O pad network. The embodiments as described herein also can be substantially less costly, quicker to implement, and less design intrusive than other approaches. This approach can also be implemented in an IC without requiring additional power clamps and without requiring additional pins, both of which can result in substantial cost savings. By contrast, a solution that involves adding a clamp likely requires adding area to the pad ring and adding bumps to the IC, which may be undesirable.

In some embodiments where an IC includes a plurality of ESD circuits, associated booster cells may be strategically placed at different locations depending on the distances between the input I/O pad of a given ESD circuit and the closest P/G pad, for example.

In various embodiments, the metals used for the bus rails in the semiconductor fabrication process may be identical (in part or in whole) to the those metals used for the I/O and/or P/G pads. Further, in some embodiments, the electrical connection(s) between spaced-apart conductors provided by the booster cell include a conductor width that is smaller than the width of the any of the P/G pads, a factor which conserves die area. The metal(s) used for the booster cell may in some embodiments be the same as the metal(s) used for the P/G pad.

In an embodiment, the metal width of the booster cell can be maximized to the maximum metal width available for metal 1, metal 2, and metal 3 used in the fabrication process to reduce resistance from the I/O pad over the rails to the clamp. (In other configurations, different metal categories are also possible). Further, in some embodiments, the lower metals (1/2/3) can be used in the booster cell to connect the lower and upper rails using a maximum width permissible by the fabrication process.

Further, unlike I/O pads which are often populated with circuit components that can include thousands of transistors, the booster cell as described herein includes no resource-consuming circuitry within it. Thus the booster cell can use the lower metals and their maximum allowable width exclusively to short the rails. These shorted rails adjacent the input I/O pad may operate to further reduce the resistance value between the ESD diode and the power clamp without affecting the geometry of the I/O pad network.

It will be appreciated by those skilled in the art upon perusal of this disclosure that the structure of the booster cell in general is focused on improving the metal connectivity of the upper and lower power rails. Accordingly, different metals and different fabrication technologies may be used over the ones described above to accomplish this objective without departing from the spirit or scope of the present disclosure.

As one example of many applications that can benefit from the ESD circuits of this disclosure, a storage device is described. However, as noted above, the ESD circuit described herein may be used in a wide variety of IC-based applications. Accordingly, any reference to a specific apparatus or method is intended only to illustrate the various aspects of the present disclosure, with the understanding that such aspects may have a wide range of applications without departing from the spirit and scope of the present disclosure.

A storage device may include multiple dies sharing a bus with the controller. In addition to the common process, voltage, and temperature (PVT) variations that may affect operation of the various dies, specific dies may receive ESD-related voltage fluctuations, which may further affect output driver performance or influence other factors for the time duration of the ESD. In other cases, the various controller and flash devices may be implemented as an SoC. These SoCs may be configured with the ESD circuits of the present disclosure.

Figure 1:
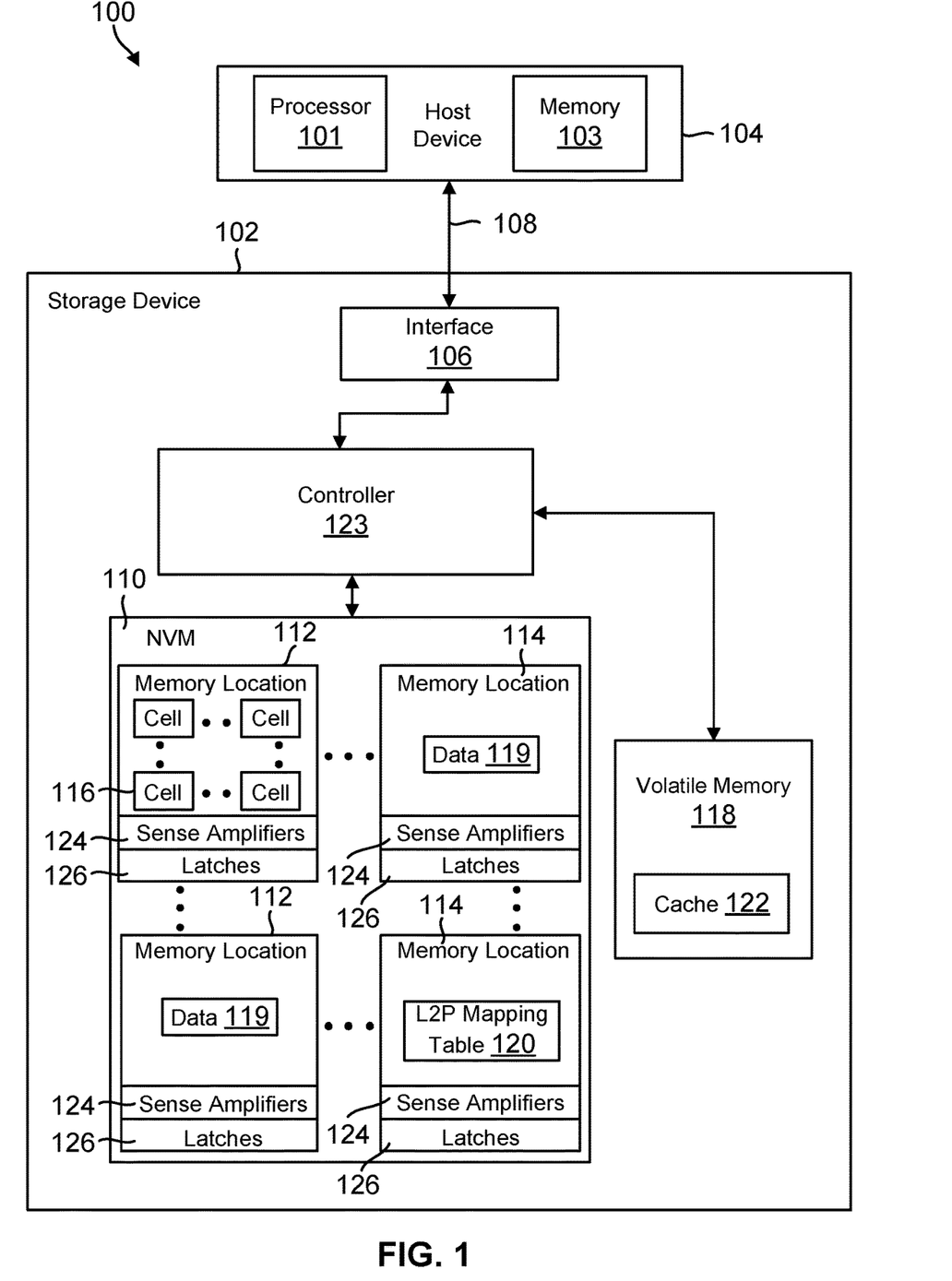
FIG. 1 is a block diagram illustrating an exemplary embodiment of a storage device in communication with a host device.

FIG. 1 shows an exemplary block diagram 100 of a storage device 102 which communicates with a host device 104 (also "host") according to an exemplary embodiment. The host 104 and the storage device 102 may form a system, such as a computer system (e.g., server, desktop, mobile/laptop, tablet, smartphone, etc.). The components of FIG. 1 may or may not be physically co-located. In this regard, the host 104 may be located remotely from storage device 102. Although FIG. 1 illustrates that the host 104 is shown separate from the storage device 102, the host 104 in other embodiments may be integrated into the storage device 102, in whole or in part. Alternatively, the host 104 may be distributed across multiple remote entities, in its entirety, or alternatively with some functionality in the storage device 102.

Those of ordinary skill in the art will appreciate that other exemplary embodiments can include more or less than those elements shown in FIG. 1 and that the disclosed processes can be implemented in other environments. For example, other exemplary embodiments can include a different number of hosts communicating with the storage device 102, or multiple storage devices 102 communicating with the host(s).

The host device 104 may store data to, and/or retrieve data from, the storage device 102. The host device 104 may include any computing device, including, for example, a computer server, a network attached storage (NAS) unit, a desktop computer, a notebook (e.g., laptop) computer, a tablet computer, a mobile computing device such as a smartphone, a television, a camera, a display device, a digital media player, a video gaming console, a video streaming device, or the like. The host device 104 may include at least one processor 101 and a host memory 103. The at least one processor 101 may include any form of hardware capable of processing data and may include a general purpose processing unit (such as a central processing unit (CPU)), dedicated hardware (such as an application specific integrated circuit (ASIC)), digital signal processor (DSP), configurable hardware (such as a field programmable gate array (FPGA)), or any other form of processing unit configured by way of software instructions, firmware, or the like. The host memory 103 may be used by the host device 104 to store data or instructions processed by the host or data received from the storage device 102. In some examples, the host memory 103 may include non-volatile memory, such as magnetic memory devices, optical memory devices, holographic memory devices, flash memory devices (e.g., NAND or NOR), phase-change memory (PCM) devices, resistive random-access memory (ReRAM) devices, magnetoresistive random-access memory (MRAM) devices, ferroelectric random-access memory (F-RAM), and any other type of non-volatile memory devices. In other examples, the host memory 103 may include volatile memory, such as random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like). The host memory 103 may also include both non-volatile memory and volatile memory, whether integrated together or as discrete units.

The host interface 106 is configured to interface the storage device 102 with the host 104 via a bus/network 108, and may interface using, for example, Ethernet or WiFi, or a bus standard such as Serial Advanced Technology Attachment (SATA), PCI express (PCIe), Small Computer System Interface (SCSI), or Serial Attached SCSI (SAS), among other possible candidates. Alternatively, the host interface 106 may be wireless, and may interface the storage device 102 with the host 104 using, for example, cellular communication (e.g. 5G NR, 4G LTE, 3G, 2G, GSM/UMTS, CDMA One/CDMA2000, etc.), wireless distribution methods through access points (e.g. IEEE 802.11, WiFi, HiperLAN, etc.), Infra Red (IR), Bluetooth, Zigbee, or other Wireless Wide Area Network (WWAN), Wireless Local Area Network (WLAN), Wireless Personal Area Network (WPAN) technology, or comparable wide area, local area, and personal area technologies.

As shown in the exemplary embodiment of FIG. 1, the storage device 102 includes non-volatile memory (NVM) 110 for persistent storage of data received from the host 104. The NVM 110 can include, for example, flash integrated circuits, NAND memory (e.g., single-level cell (SLC) memory, multi-level cell (MLC) memory, triple-level cell (TLC) memory, quad-level cell (QLC) memory, penta-level cell (PLC) memory, or any combination thereof), or NOR memory. The NVM 110 may include a plurality of memory locations 112 which may store system data for operating the storage device 102 or user data received from the host for storage in the storage device 102. For example, the NVM may have a cross-point architecture including a 2-D NAND array of memory locations 112 having n rows and m columns, where m and n are predefined according to the size of the NVM. In the illustrated exemplary embodiment of FIG. 1, each memory location 112 may be a block 114 including multiple cells 116. The cells 116 may be single-level cells, multi-level cells, triple-level cells, quad-level cells, and/or penta-level cells, for example. Other examples of memory locations 112 are possible; for instance, each memory location may be a die containing multiple blocks. Moreover, each memory location may include one or more blocks in a 3-D NAND array. Moreover, the illustrated memory locations 112 may be logical blocks which are mapped to one or more physical blocks.

The storage device 102 also includes a volatile memory 118 that can, for example, include a Dynamic Random Access Memory (DRAM) or a Static Random Access Memory (SRAM). Data stored in volatile memory 118 can include data read from the NVM 110 or data to be written to the NVM 110. In this regard, the volatile memory 118 can include a write buffer or a read buffer for temporarily storing data. While FIG. 1 illustrates the volatile memory 118 as being remote from a controller 123 of the storage device 102, the volatile memory 118 may be integrated into the controller 123.

The memory (e.g. NVM 110) is configured to store data 119 received from the host device 104. The data 119 may be stored in the cells 116 of any of the memory locations 112. As an example, FIG. 1 illustrates data 119 being stored in different memory locations 112, although the data may be stored in the same memory location. In another example, the memory locations 112 may be different dies, and the data may be stored in one or more of the different dies.

Each of the data 119 may be associated with a logical address. For example, the NVM 110 may store a logical-to-physical (L2P) mapping table 120 for the storage device 102 associating each data 119 with a logical address. The L2P mapping table 120 stores the mapping of logical addresses specified for data written from the host 104 to physical addresses in the NVM 110 indicating the location(s) where each of the data is stored. This mapping may be performed by the controller 123 of the storage device. The L2P mapping table may be a table or other data structure which includes an identifier such as a logical block address (LBA) associated with each memory location 112 in the NVM where data is stored. While FIG. 1 illustrates a single L2P mapping table 120 stored in one of the memory locations 112 of NVM to avoid unduly obscuring the concepts of FIG. 1, the L2P mapping table 120 in fact may include multiple tables stored in one or more memory locations of NVM.

Figure 2:
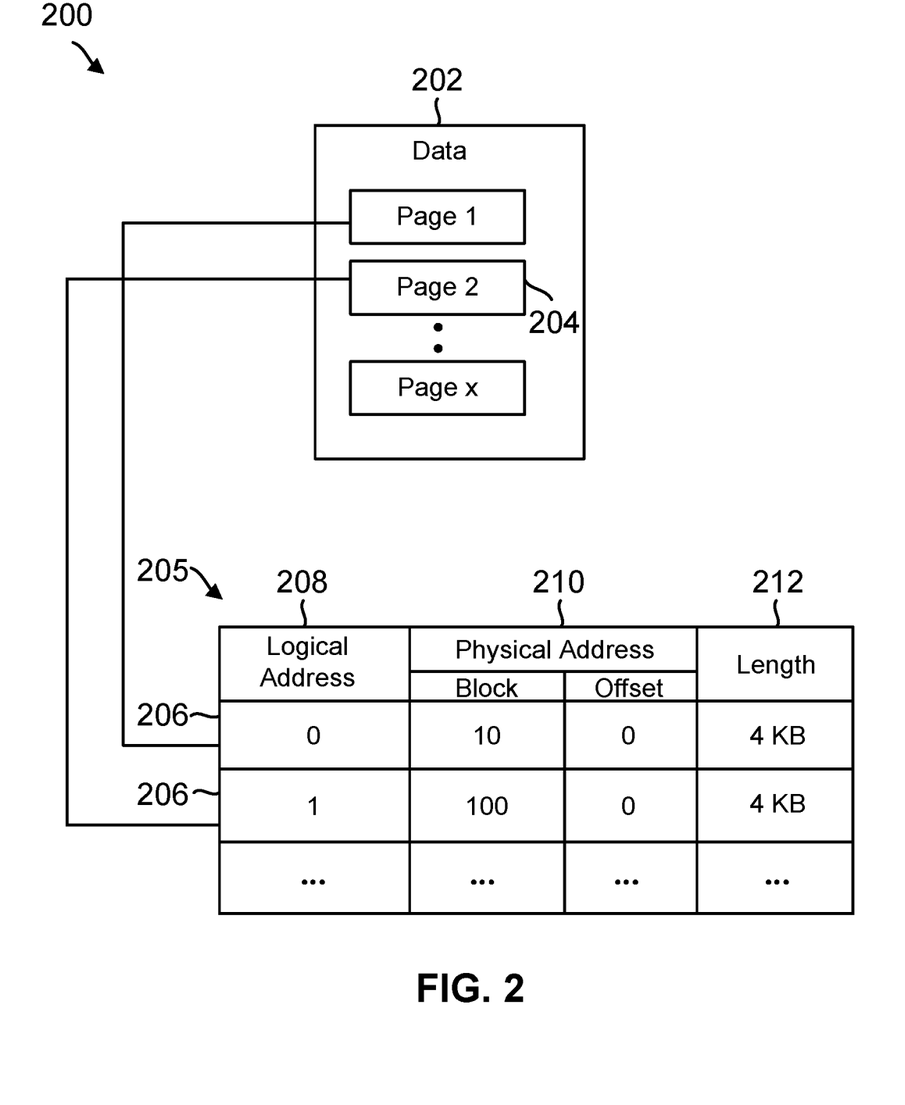
FIG. 2 is a conceptual diagram illustrating an example of a logical-to-physical mapping table in a non-volatile memory of the storage device of FIG. 1.

FIG. 2 is a conceptual diagram 200 of an example of an L2P mapping table 205 illustrating the mapping of data 202 received from a host device to logical addresses and physical addresses in the NVM 110 of FIG. 1. The data 202 may correspond to the data 119 in FIG. 1, while the L2P mapping table 205 may correspond to the L2P mapping table 120 in FIG. 1. In one exemplary embodiment, the data 202 may be stored in one or more pages 204, e.g., pages 1 to x, where x is the total number of pages of data being written to the NVM 110. Each page 204 may be associated with one or more entries 206 of the L2P mapping table 205 identifying a logical block address (LBA) 208, a physical address 210 associated with the data written to the NVM, and a length 212 of the data. LBA 208 may be a logical address specified in a write command for the data received from the host device. Physical address 210 may indicate the block and the offset at which the data associated with LBA 208 is physically written. Length 212 may indicate a size of the written data (e.g. 4 KB or some other size).

Referring back to FIG. 1, the volatile memory 118 also stores a cache 122 for the storage device 102. The cache 122 includes entries showing the mapping of logical addresses specified for data requested by the host 104 to physical addresses in NVM 110 indicating the location(s) where the data is stored. This mapping may be performed by the controller 123. When the controller 123 receives a read command or a write command for data 119, the controller checks the cache 122 for the logical-to-physical mapping of each data. If a mapping is not present (e.g. it is the first request for the data), the controller accesses the L2P mapping table 120 and stores the mapping in the cache 122. When the controller 123 executes the read command or write command, the controller accesses the mapping from the cache and reads the data from or writes the data to the NVM 110 at the specified physical address. The cache may be stored in the form of a table or other data structure which includes a logical address associated with each memory location 112 in NVM where data is being read.

The NVM 110 includes sense amplifiers 124 and data latches 126 connected to each memory location 112. For example, the memory location 112 may be a block including cells 116 on multiple bit lines, and the NVM 110 may include a sense amplifier 124 on each bit line. Moreover, one or more data latches 126 may be connected to the bit lines and/or sense amplifiers. The data latches may be, for example, shift registers. When data is read from the cells 116 of the memory location 112, the sense amplifiers 124 sense the data by amplifying the voltages on the bit lines to a logic level (e.g. readable as a '0' or a '1'), and the sensed data is stored in the data latches 126. The data is then transferred from the data latches 126 to the controller 123, after which the data is stored in the volatile memory 118 until it is transferred to the host device 104. When data is written to the cells 116 of the memory location 112, the controller 123 stores the programmed data in the data latches 126, and the data is subsequently transferred from the data latches 126 to the cells 116.

The storage device 102 includes a controller 123 which includes circuitry such as one or more processors for executing instructions and can include a microcontroller, a Digital Signal Processor (DSP), an Application-Specific Integrated Circuit (ASIC), a Field Programmable Gate Array (FPGA), hard-wired logic, analog circuitry and/or a combination thereof.

The controller 123 is configured to receive data transferred from one or more of the cells 116 of the various memory locations 112 in response to a read command. For example, the controller 123 may read the data 119 by activating the sense amplifiers 124 to sense the data from cells 116 into data latches 126, and the controller 123 may receive the data from the data latches 126. The controller 123 is also configured to program data into one or more of the cells 116 in response to a write command. For example, the controller 123 may write the data 119 by sending data to the data latches 126 to be programmed into the cells 116. The controller 123 is further configured to access the L2P mapping table 120 in the NVM 110 when reading or writing data to the cells 116. For example, the controller 123 may receive logical-to-physical address mappings from the NVM 110 in response to read or write commands from the host device 104, identify the physical addresses mapped to the logical addresses identified in the commands (e.g. translate the logical addresses into physical addresses), and access or store data in the cells 116 located at the mapped physical addresses.

The controller 123 and its components may be implemented with embedded software that performs the various functions of the controller described throughout this disclosure. Alternatively, software for implementing each of the aforementioned functions and components may be stored in the NVM 110 or in a memory external to the storage device 102 or host device 104, and may be accessed by the controller 123 for execution by the one or more processors of the controller 123. Alternatively, the functions and components of the controller may be implemented with hardware in the controller 123, or may be implemented using a combination of the aforementioned hardware and software.

In operation, the host device 104 stores data in the storage device 102 by sending a write command to the storage device 102 specifying one or more logical addresses (e.g., LBAs) as well as a length of the data to be written. The interface element 106 receives the write command, and the controller allocates a memory location 112 in the NVM 110 of storage device 102 for storing the data. The controller 123 stores the L2P mapping in the NVM (and the cache 122) to map a logical address associated with the data to the physical address of the memory location 112 allocated for the data. The controller also stores the length of the L2P mapped data. The controller 123 then stores the data in the memory location 112 by sending it to one or more data latches 126 connected to the allocated memory location, from which the data is programmed to the cells 116.

The host 104 may retrieve data from the storage device 102 by sending a read command specifying one or more logical addresses associated with the data to be retrieved from the storage device 102, as well as a length of the data to be read. The interface 106 receives the read command, and the controller 123 accesses the L2P mapping in the cache 122 or otherwise the NVM to translate the logical addresses specified in the read command to the physical addresses indicating the location of the data. The controller 123 then reads the requested data from the memory location 112 specified by the physical addresses by sensing the data using the sense amplifiers 124 and storing them in data latches 126 until the read data is returned to the host 104 via the host interface 106.

It will be appreciated that the resistance from the ESD I/O pad to the clamp may vary based on generally well-understood process and temperature variations in an exemplary CMOS process. As such, the range of possible resistance values that may be achieved may be considered when implementing an ESD circuit in accordance with this disclosure.

Figure 3:
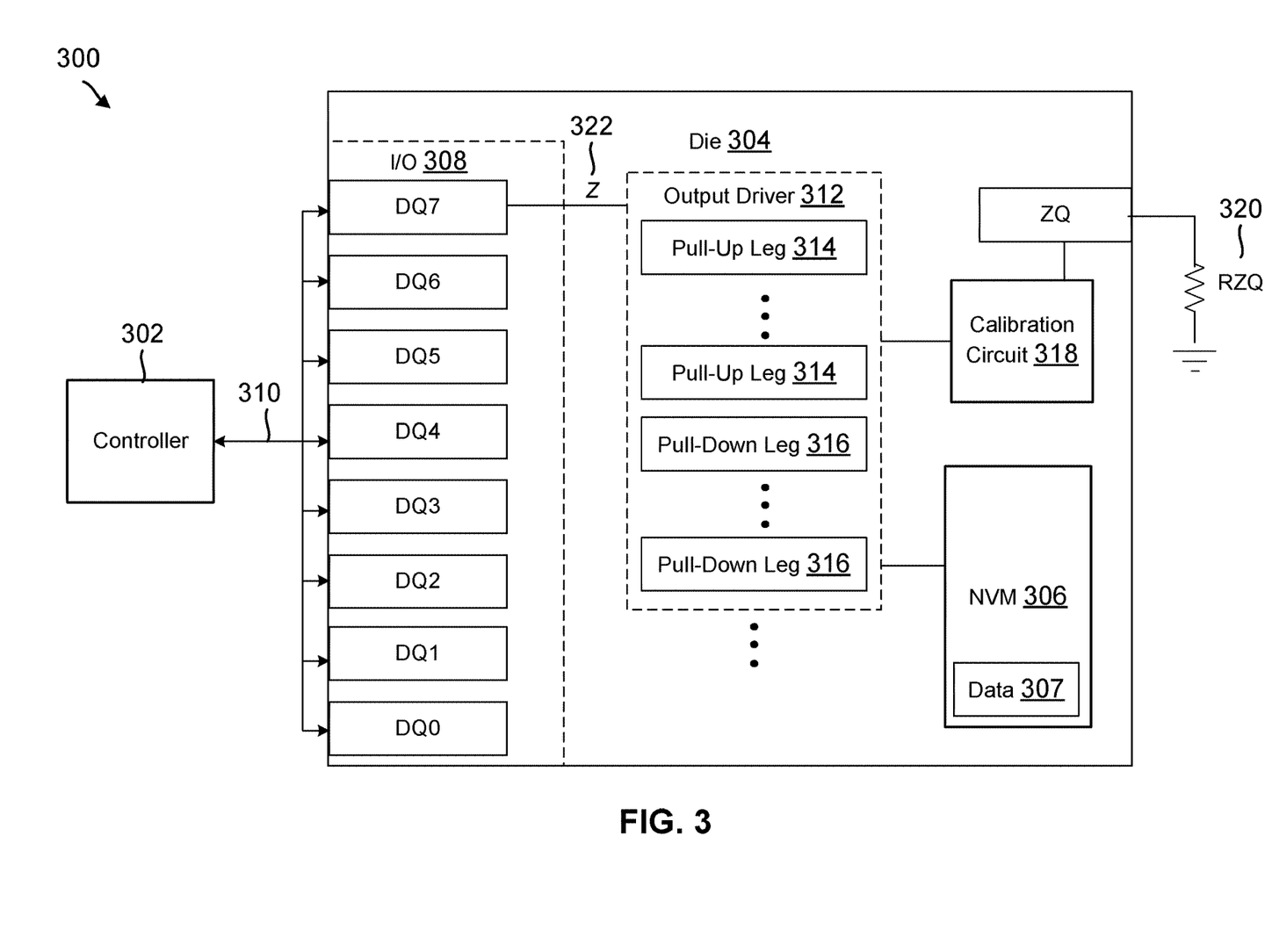
FIG. 3 is a conceptual diagram illustrating an example of a die including a calibration circuit and an output driver for communicating data to a controller in the storage device of FIG. 1.

FIG. 3 illustrates an example diagram 300 illustrating a controller 302 in communication with a die 304 over a bus. Die 304 may include a NVM 306 that stores data 307 (e.g. data 119 of FIG. 1). Die 304 may represent a candidate component for implementing one or more ESD circuits using booster cells in accordance with this disclosure.

The controller 302 may correspond to controller 123 of FIG. 1, and the NVM 306 of die 304 may correspond to the memory location 112 of FIG. 1. Each die may include various pins which serve as interfaces between the controller and the die. For example, the die may include an input/output (I/O) 308 which is configured to receive inputs and transmit outputs (e.g. input data and commands from the controller to read, write, or erase data, and output data from the NVM 306). I/O 308 may include a number of data lines or pins (DQ) that receive individual bits of input data and send individual bits of output data over a bus 310. In the example of FIG. 3, the bus 310 may be an 8-bit bus which interfaces with eight DQ pins (DQ7:0), although a different bus width and number of DQs may be used (e.g. a 16-bit bus with 16 DQs). For clarity, only I/O 308 is illustrated in FIG. 3 for die 304; however die 304 may include other pins. For instance, the die may include a CE for receiving a chip-enable signal from the controller, a ready/busy (R/B) for outputting a ready or busy status to the controller, an address latch enable (ALE) for latching addresses into NAND, a command latch enable (CLE) for latching commands into a command register, a RE (read enable) for enabling output data buffers, a WE (write enable) for clocking data, addresses, or commands into the NAND, a bidirectional data strobe signal (DQS) that clocks the I/O 308 to receive and transmit data over the bus 310, and one or more P/G pins for providing power to the circuit elements die 304. Die 304 may also include an I/O pin associated with an ESD circuit, including one or more steering diodes. In addition, the die may include a booster cell adjacent the ESD I/O pad associated with the I/O pin and a P/G pad that includes a power clamp.

Moreover, while FIG. 3 illustrates a single die in communication with the controller 302, it should be understood that multiple dies may communicate with the controller over the bus 310, and the ESD circuit described herein may be applied to those multiple dies as necessary.

The die 304 may include an output driver 312 for each DQ pin. For clarity, only one output driver 312 is illustrated for DQ7, although separate output drivers may be connected to the other DQs. Each output driver 312 may be a CMOS driver that includes pull-up legs 314 (p-type metal-oxide-semiconductor (PMOS) transistors) for pulling up the voltage of the data output on the DQ line to a logic 1 and pull-down legs 316 (n-type metal-oxide-semiconductor (NMOS) transistors) for pulling down the voltage of the data output on the DQ line to a logic 0. The die 304 may also include a calibration circuit 318 connected via a ZQ pin to a calibration resistor 320 (RZQ) which is external to the die 304. The calibration circuit 318 may calibrate an output impedance 322 of each output driver 312 based on the resistance of the calibration resistor 320.

FIG. 4 is a block diagram illustrating an example of an ESD circuit 400 for protecting an IC from an ESD-induced voltage using steering diodes 450, 452, 454 and 456 and a power clamp 418. To meet ESD requirements, a protection technique typically uses low resistance discharge paths to maintain the voltage levels developed on power rails below a device breakdown voltage. ESD circuit 400 includes a signal pad input 406 (typically connected to a pin adjacent a die edge) for receiving an ESD discharge, and a P/G pad 416 located at some distance away from the signal pad 406. Power is supplied to the ESD circuit 400 via VDD 402 and GND 408 inputs. GND 408 is also referred to herein as VSS. VDD 402 and GND 408 are coupled respectively via signal pad 406 to a power rail 410 and ground rail 426. The power 410 and ground rails may each be implemented using one or more metallic traces or conductors that may extend across an I/O pad ring.

In the example shown, an "ESD zap" 404 from a person handling the IC, or another arbitrary source of charge, makes contact with PAD1 407, e.g., via the pin associated with PAD1 407. Here it is assumed initially that the polarity of the charge is such that it produces a positive voltage spike at node 440 relative to the VDD source 402. Accordingly, diode 450 is turned on and the ensuing current flow is represented by the dashed line 460. The current flows through diode 450, power rail 410, and then through a power clamp 418, which in this example includes an n-type MOSFET transistor having a gate voltage controlled by RC circuit 420. The gate voltage (and thus VGS) may be controlled so that the power clamp is on to enable the current flow. The current flows through the ground rail 426 (as shown by 460) to signal pad 428 and the node at GND pad 434. At that point, steering diode 456 turns on by virtue due to the positive potential difference across it, and the current is discharged through PAD2 432.

During the discharge, the current is subjected to the resistance of the rails, which is modeled in FIG. 4 as R1 and R4 for the path used.

Notably, in the case where the ESD Zap 404 has the opposite polarity, the current instead flows through steering diode 452 (which turns on as the voltage at node 440 drops below the ground voltage at GND 408), up through the power clamp 418, and through steering diode 454 to PAD2 432. The current in this case flows through R2 and R3, which model the GND/VSS rail 408 and Power/VDD rail 410, respectively.

One objective in this ESD circuit 400 is to maintain as low values of R1-R4 as possible, e.g., by designing the bus suitably to include multiple conductors where possible, and to design the conductors to be as wide as is permitted. In the above example, if R1 and R4 are sufficiently high and the current is high then the voltage on the bus rails can exceed a device breakdown voltage, thereby damaging the ESD circuit 400 or the device itself.

Exemplary requirements for an ESD circuit may vary widely, but as an example, the requirements may include protection of 4 KV using the human body model (HBM) and a current of 2.6 Amps. As noted above, the ESD device-to-clamp resistances (R1, R2, R3, and R4) may need to be maintained at 0.5-1.0Ω (ohms).

One shortcoming of the above ESD circuit is that the rails in practice may have geometrical limitations (width of conductors) and numerical limitations (number of conductors). Thus the resistance becomes higher as the distance between the input pad and the clamp increases. Where certain types of ICs place practical limitations on the number and width of conductors that form the respective power and ground rails, the above approach can fall short, and higher-than-minimum bus resistance values can result in frequent ESD breakdowns and potential non-compliance with industry standards.

FIG. 5 is a diagram illustrating an example of an ESD circuit 500 implemented on a pad ring 548 bordering a die edge 550 on one side and a core side 563 on the other side. The core side 563 may include, for example, the memory and/or controller circuits described in FIGS. 1-3. Pad ring 548 includes a plurality of I/O Pads including I/O pad-1 through I/O pad-9. A P/G pad 532 is included adjacent I/O pad-9. VDD and VSS may be used to provide power and ground to the ESD circuit 500 and/or to other devices on the IC.

The ESD circuit 500 in this embodiment includes upper rails 519, which in turn includes VDD conductor 506 and VSS conductor 502. Similarly, the ESD circuit includes lower rails 551 including VDD conductor 538 and VSS conductor 534. It will be appreciated that the number of conductors and the configuration of the power and ground rails may vary. For example, depending on the die or the IC design, the power and ground rails may vary in number, position width, length, and material type, for example. In the pad ring 548 shown in FIG. 5, the VDD and VSS conductors are placed in different locations, one of each at the bottom of the ring proximate the steering diode 544, and one of each at the top of the ring that extend near the power clamp 510. The possible configurations have certain constraints due to the layout of the I/O pads and the existing circuitry in the I/O pads, however, that can hinder performance of the ESD circuit as described below.

Referring still to FIG. 5, pad 542 may provide an input pad 542 for an ESD event. Steering diode 544, similar to steering diode 450 of FIG. 4, may be used to steer the current to the VDD rail 538. That is, in FIG. 5, the pad or I/O pin 542 is connected to the steering diode 544 implemented in the die in the lower portion of I/O pad-1. The output of the steering diode 544 connects to a lower VDD rail (conductor 538). It should be noted that the ESD circuit 500 may also provide a steering diode for negative voltage transients (similar to diode 452 of FIG. 4), but for simplicity in this figure, only the positive voltage case is illustrated.

The arrow-terminated line 512 and the included resistor R1 is used to represent the total current path and the resistance encountered by the current along that total path from the output of the steering diode 544 to the drain of the power clamp 510. The current in FIG. 5 passes through the VDD rail 538 of the lower rails 551 and through a plurality of vertical metal layer interconnects 532a-d formed in the P/G pad 532. The vertical interconnects 532a-d, which operate to short the upper and lower VDD rails and decrease, if only marginally, the resistance R1 (relative to having just one vertical interconnect of the same width), lead to the drain of power clamp 510. The current then passes through the power clamp and through the VSS rail 502 of the upper rails 519.

This circuit has shortcomings. For one, the proximity of I/O pad-1 to the power clamp 510 impacts the resistance of the VDD rail. The farther away the I/O pad-1 from the power clamp 510, the larger R1 becomes. Further, in the layout of an I/O pad, the lower metals (e.g., metal1, metal2, and metal3) may be used to create the routings for internal circuits. That is to say, the I/O pads are typically designed to include circuitry that already uses these metal layers, such as, for example, for use in transmitters, receivers, drivers, and other I/O-based circuitry that generally needs to be positioned closer to the die edge. Populating these I/O pads with circuitry using the lower metals in turn leaves very little resources in the I/O pad to short the upper and lower rails for use in the ESD circuit to thereby reduce the resistance R1. Thus, as is illustrated in FIG. 5, the presence of vertical interconnects is limited to the P/G pad.

While only R1 from FIG. 4 is illustrated, the remaining rails that create resistors R2-R4 would have similar problems. R2 would be located directly above R1, in the VSS rail 534. R3 and R4 would be present in a similar ESD circuit that includes another section of the pad ring and another P/G pad, such as to the right of the pad ring 548 shown in FIG. 5. (A similar configuration is described further below with reference to FIG. 6B.)

The non-availability of metal resources in an I/O pad generally precludes a designer from placing connectors in the I/O pad between the upper rails 519 and lower rails 551 (e.g., connecting VDD conductor 506 with VDD conductor 538, and separately between VSS conductor 502 and VSS conductor 534. Without these vertical connections, R1 may remain at an undesirably high value. The comparatively high resistance of the VDD rail 538 as characterized by R1 increases the likelihood that the resistance will exceed the minimum required value and that an ESD event will create a voltage drop that causes a permanent breakdown.

Various techniques have been used as an attempt to overcome the above-described deficiencies in the ESD circuit 500. One approach that has been suggested is to add another P/G pad including another clamp between the existing I/O pad-2 through I/O pad-9. In this case, the distance between the steering diode 544 at I/O pad-1 and the clamp at the new P/G pad is shortened, in turn reducing the resistance at the rails. However, in core-limited designs where the die area is constrained, adding an additional pad is ordinarily not feasible as it would occupy an excessive amount of area. Moreover, the addition of a P/G pad would increase the bump (pin) requirements, since adding a clamp would require an additional external P/G pin to the IC to provide a current path for the ESD discharge. Adding a pin in an already constrained core design can potentially add a different and bigger set of complications as the limited IC real estate is further taxed. Yet another problem with this approach is that an additional power clamp may cause further leakage current, reducing overall IC performance.

Another solution that has been proposed is to increase the width of the horizontal metal bus rails, which reduces R1-R4. However, with this increase comes a necessary increase in the height of the I/O pad, which in core-limited designs is likely already subject to a preexisting height constraint. This approach limits the core area, and consequently is not likely to be considered a desirable option in such core-limited designs.

Still another approach is to add additional rails—for example, other than the upper and lower rails 519 and 551—to provide additional conductors to decrease R1-R4. This approach would similarly require the pad ring 548 to be heighted to accommodate the additional rails and to make sufficient room for the additional metal traces amidst the pre-existing I/O pad circuitry. This approach is therefore undesirable for the same reasons as widening the bus rails.

A further attempted solution is to add additional metal layers, this time stacking additional metal masks to the I/O pad rails. For example, if nine metal layers are used between the lower and upper rails to provide routing for I/O circuitry, it may be possible to add metals 10-12 to the I/O pads for providing another current path to the power clamp while reducing resistance of the rail. This approach would not only be costly due to the increased metal layers and fabrication processing resources and time, but also it is currently infeasible. As noted above, the I/O pads in present IC applications commonly include circuits having thousands of transistors, which invariably use all the existing metal layers, leaving no other layers in the I/O pads to traverse the rails and reduce the resistance.

Figure 6A:
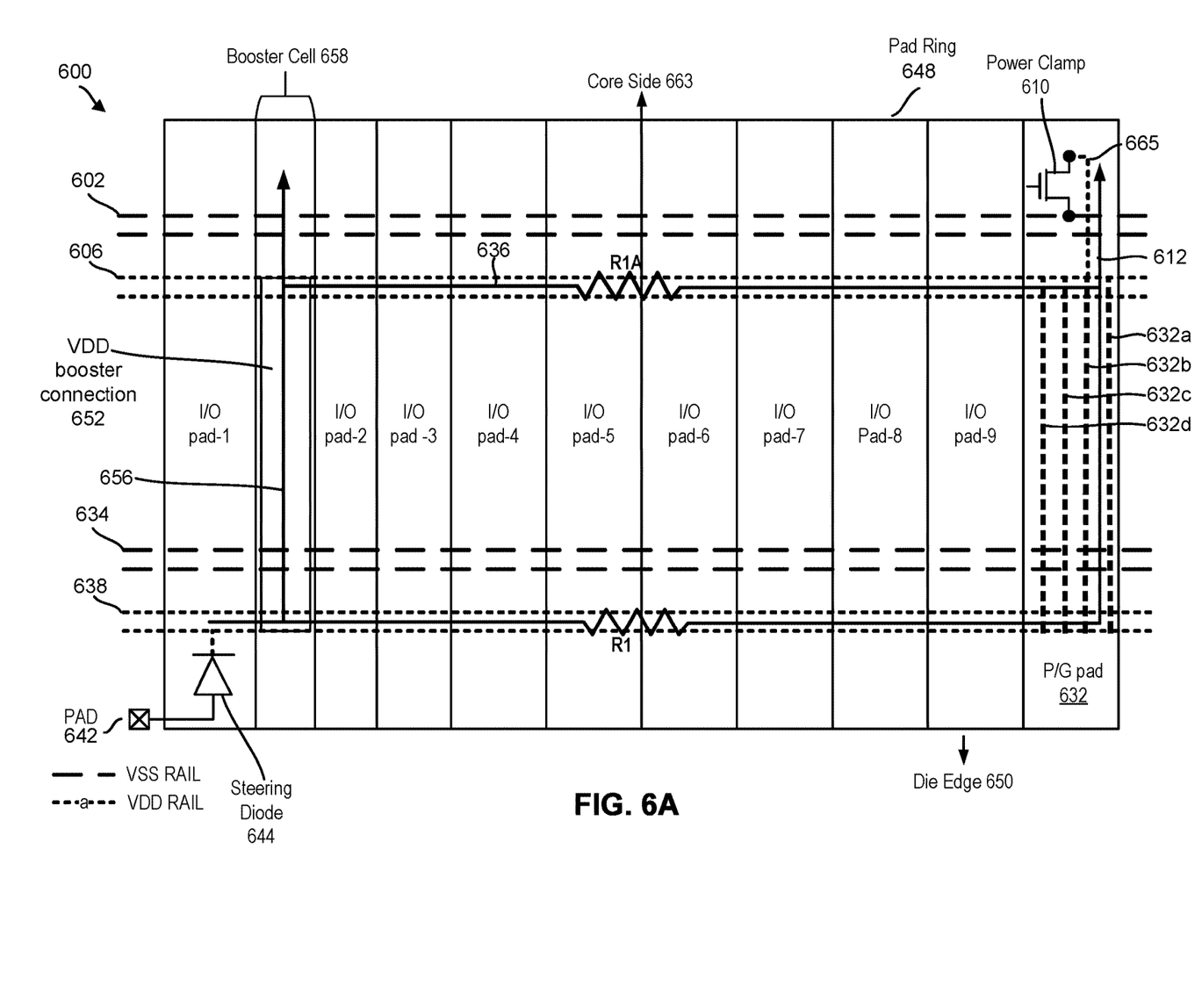
FIG. 6A is a diagram illustrating an example of an ESD circuit including a booster cell between I/O pad-land the P/G pad.

Accordingly, in an aspect of the disclosure that addresses the aforementioned problems, the ESD circuit is modified to include a booster cell 658. FIG. 6A is a diagram illustrating an example of an ESD circuit 600 including a booster cell 658 physically located between I/O pad-1 and P/G pad 632. Similar to FIG. 5, FIG. 6A shows a pad ring 648 sandwiched between a core side 663 and a die edge 650, upper rails including VSS rail 602 and VDD rail 606, lower rails including VSS rail 634 and VDD rail 638, a current path 612 and resistor R1 representing the VDD rail resistance from the steering diode output to the power clamp 610, and vertical interconnects that 632a-d that short the upper and lower VDD rails and that carry the part of the current in path 612 to the drain 665 of power clamp 610.

In an embodiment, the booster cell 658 is inserted between I/O pad-1 and I/O pad-2, and adjacent the steering diode 644. Further, in an embodiment, the booster cell 658 may include the metal layers (or in other embodiments, a subset or superset thereof) that are generally used in each I/O pad for internal circuitry connections (such as metal1-metal3 in the example above). The booster cell 658 uses one or more of the metals to produce a vertical conductor (VDD booster connection 652) that shorts the upper and lower VDD rails within the booster cell 658. (In other embodiments, the booster cell can be configured adjacent a similar steering diode, but one that instead provides a ground path for pad 642, to short the upper and lower VSS rails.) Consequently, current has an added path 656 (i.e., VDD booster connection 652) and 636 (VDD rail 606) to flow to the power clamp 610. The added path has similar resistance value R1A such that the total discharge path resistance from the steering diode 644 to the power clamp 610 can be correspondingly reduced further by virtue of the parallel connection.

Referring still to the exemplary embodiment of FIG. 6A, the booster cell 658 includes a vertically-disposed VDD booster connection 652 that is substantially wider than the vertical interconnects 632a-d used to carry the current through path 612. The booster cell 658 advantageously lacks potentially interfering circuitry present in the I/O pads. As such, the booster cell 658 may be implemented as a metal layer, and the layer may be designed to the maximum width possible permissible for the particular metal(s) in light of the fabrication process.

In contrast to the booster cell 658, the interconnects 632a-d can be limited by the presence of power circuitry that may be included within P/G pad 632, similar to the I/O circuitry present in the I/O pads. This power circuitry may limit the width of the P/G-based interconnects 632a-d. As a result, the parallel resistor R1 may be slightly higher than R1A, the latter of which has the benefit of the wide vertical connection 652. In other embodiments, the total width of the VDD connection 652 on one hand and the interconnects 632a-d on the other hand are similar, making the resistances R1 and R1A about equal and reducing the overall parallel resistance.

While FIG. 6A shows the booster cell 658 as applied only to R1 to avoid unduly obscuring the concepts of the disclosure, it will be appreciated that the principles of the disclosure can be applied with equal force to the resistors R2, R3 and R4 in FIG. 4. An example of this configuration is set forth in FIG. 6B, described further below.

It should be noted that the previous figures are not necessarily drawn to scale, and the width of the booster cell 658 can be made much more compact than any P/G pad by 25%, 50%, or even greater, since the metal can be implemented as any arbitrary fraction of a pad width. The booster cell 658 may use the same metals to connect the bus rails as used in the P/G pads. Thus, use of the booster cell 658 can save die area. In addition, an objective of the booster cell is to improve metal connectivity of the upper and lower power rails while conserving die area. To accomplish this objective, the metal width in the booster cell can be set to the maximum metal width available during fabrication for the metal used (e.g., metal1, metal2, metal3). In addition, the booster cell metals can beneficially be made wider than the bus metals as desired.

The vertical connections provided between VDD/VSS rails by the booster cell also mean that the upper, rather than just the lower, VDD/VSS rails may be used as part of the ESD discharge path. The parallel connections of both upper rails and lower rails of the I/O ring can collectively result in a reduced resistance in the ESD discharge path.

The inventors have observed that after using the booster cells in the pad ring, the bus rail resistance due to the I/O steering diode-to-power clamp path as shown in FIG. 6 has been reduced by 17-25%. These figures are shown in Table 1, below.

TABLE 1

Effective ESD Path Resistance With And Without Booster Cell

| Distance between diode to clamp. | Effective resistance without Booster Cell | Effective resistance after inserting Booster Cell | Improvement in effective resistance |
| --- | --- | --- | --- |
| 50 um | 1.42 Ω | 1.205 Ω | 17.84% |
| 100 um | 1.52 Ω | 1.28 Ω | 18.75% |
| 150 um | 1.64 Ω | 1.371 Ω | 19.62% |
| 200 um | 1.69 Ω | 1.398 Ω | 20.89% |
| 250 um | 1.757 Ω | 1.446 Ω | 21.51% |
| 300 um | 1.788 Ω | 1.443 Ω | 23.91% |
| 500 um | 1.914 Ω | 1.54 Ω | 24.29% |

Figure 6B:
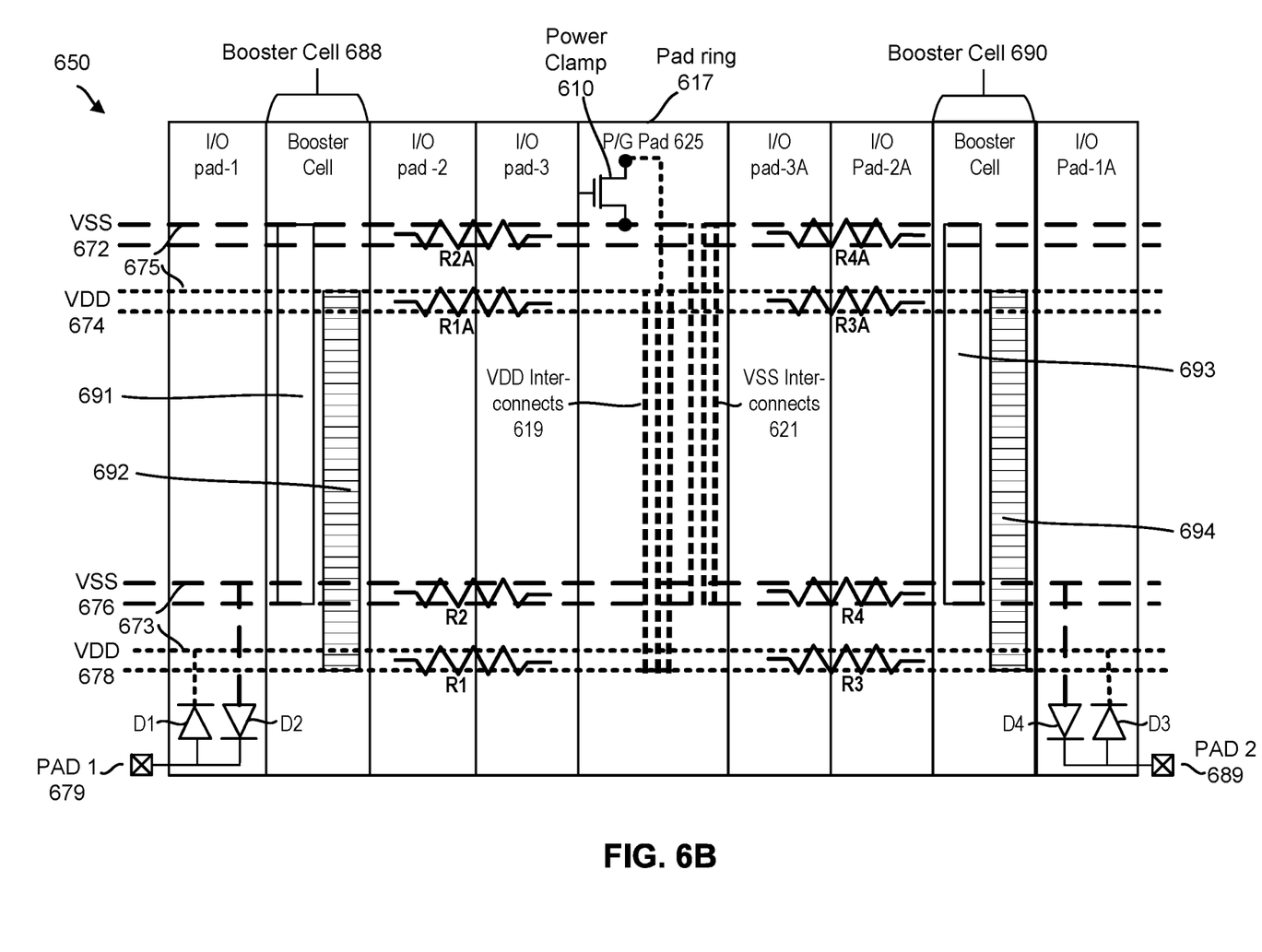
FIG. 6B is a diagram illustrating an exemplary layout of the ESD circuit of FIG. 4 modified to use booster cells.

FIG. 6B is a diagram illustrating an exemplary layout of the ESD circuit 650 of FIG. 4, modified to include booster cells 688 and 690. FIG. 6B includes a pad ring 617, including I/O pad-1, I/O pad-2, I/O pad-3, I/O pad-3A, I/O pad-2A and I/O pad-1A (from left to right). The pad ring 617 further includes P/G pad 625 sandwiched between I/O pad-3 and I/O pad-3A. A first booster cell 688 is positioned between I/O pad-1 and I/O pad-2. A second booster cell 690 is positioned between I/O pad-2A and I/O pad-3A. It should be noted that a larger number of I/O pads may be placed between I/O pad-1 and I/O pad-1A such that the distance between the clamp and the respective steering diodes is increased; however, the number of pads is reduced to simplify the illustration.

Upper rails 675 include VDD rail 674 and VSS rail 672. Lower rails 673 include VDD rail 678 and VSS rail 676.

Upper and lower rails 675 and 673 extend across the pad ring 617 to provide respective power and ground sources. The ESD discharge mechanism in FIG. 6B is similar to that of FIG. 4, except for the inclusion of the booster cells and the details of the pad interconnects. As in FIG. 4, resistors R1-R4 represent the resistance of the upper and lower rails 675 and 673.

With the inclusion of booster cell 688, the current can branch into two paths. Booster cell 688 includes a first conductor 691 between the upper and lower VSS rails 672 and 676, and a second conductor 692 between the upper and lower VDD rails 674 and 678. Booster cell 690 includes a first conductor 693 between the upper and lower VSS rails 672 and 676, and a second conductor 694 between the upper and lower VDD rails 674 and 678. In some embodiments, conductors 691 and 692 may be composed of different metals. In other embodiments where permissible, and such as to save die area or to maximize width, conductors 691 and 692 may be stacked.

For a positive voltage spike at Pad 1 (679), the current flows through D1 to the VDD rail 678. Unlike in FIG. 4, the current in FIG. 6B can split into two paths by using the conductor 692 to travel through both the upper and lower VDD rails 674 and 678 and through VDD interconnect 619 to the drain of the power clamp 610 at P/G pad 625. As before, the net resistance is reduced by the parallel combination of R1 and R1A. The current passes through the power clamp 610 and flows through VSS. In FIG. 4, the current flows through R4, through steering diode D4, and to the Pad 2 (689). In the embodiment shown in FIG. 6B, the conductor 693 of the booster cell 690 enables the current to flow through both the upper and lower VSS rails 672 and 676. The net parallel resistance of the new current path is represented by the parallel combination of R4 and R4A.

A negative voltage spike at pad-1 results in steering diode D2 turning on, and current flowing through the dual path R2 and R2A from the source of the power clamp 610. The current uses VSS interconnect 621 and booster cell conductor 691 to flow through the branched combination of upper and lower VDD rails 674 and 678, where it flows through steering diode D3 and pad-1 679. The net resistance in this case is provided by the parallel combination of R2 and R2A. Further, current through pad-2 (689) and steering diode D3 may use conductor 694 of the booster cell 690 and VDD interconnect 619 for the path to the drain of power clamp 610.

The current flow is described sometimes herein as flowing in a single direction from the left of the pad ring 617 to the right. It will be appreciated that current may actually flow in different directions, and the conventions used herein are for purposes of simplification.

Figure 7:
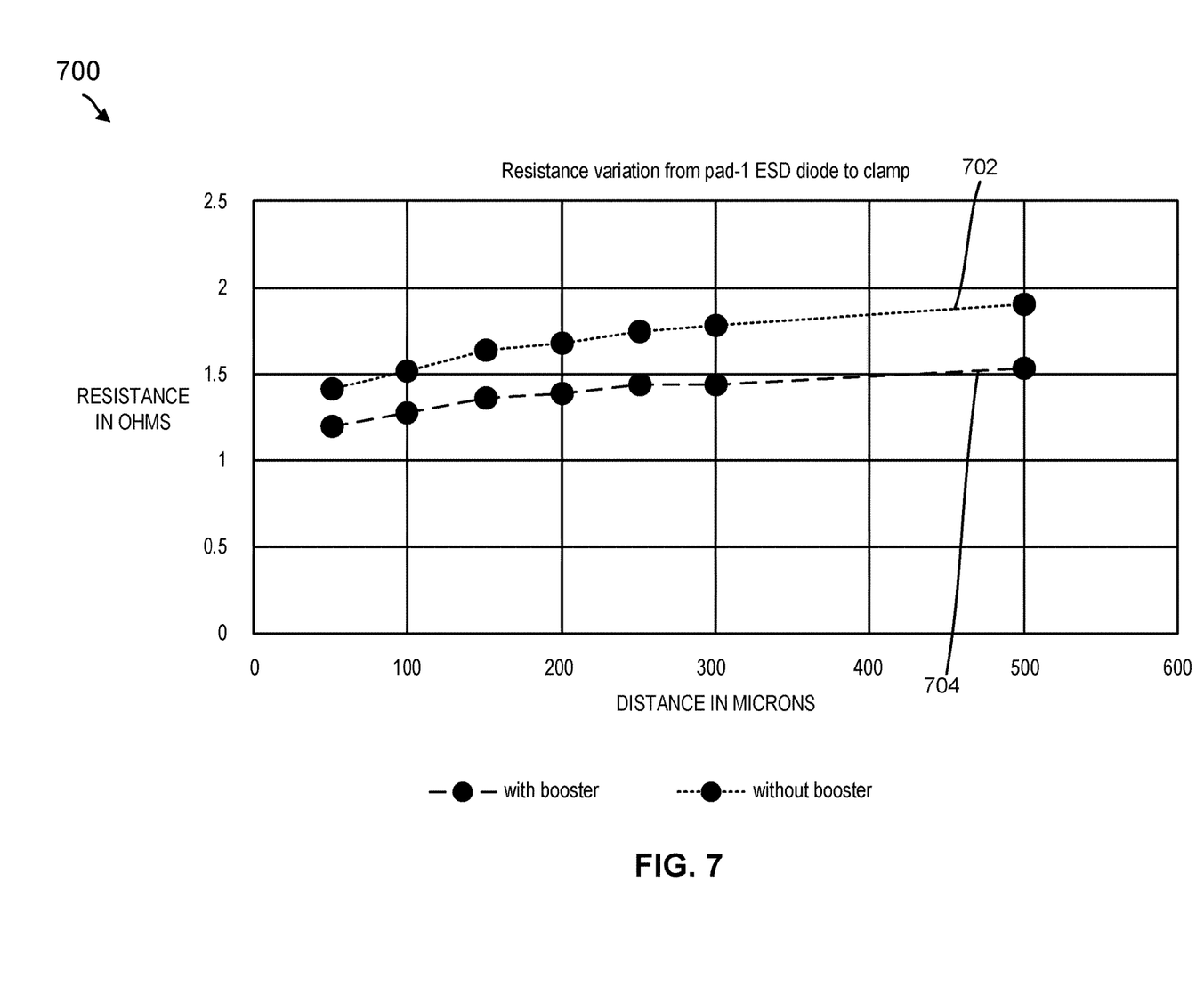
FIG. 7 is a graphical representation of the ESD path resistance over the VDD rails as a function of the distance of the I/O ESD diode to the power clamp, measured with and without the addition of the booster circuit of FIG. 6A.

FIG. 7 is a graphical representation 700 of the ESD path resistance over the VDD rails as a function of the distance of the I/O steering diode to the power clamp, measured with and without the addition of the booster circuit of FIG. 6A. The dashed line 704 includes measurements with the booster cell employed, and the dotted line 702 includes corresponding measurements without it.

Generally, based on the ESD requirements at issue, the ESD circuit can include one or more booster cells that address bus resistance based on single power, single ground, or both power and ground. FIG. 6A shows the single power case, and FIG. 6B shows the power and ground case. FIG. 7 shows a single power result, where the booster cell 658 connects the VDD rails as is shown in FIG. 6A. In additional or alternative embodiments, the booster cell can connect just ground rails (single ground), or both power and ground rails by using different metals.

While the above examples have demonstrated the value of the booster cell to reduce resistance between the steering diode and power clamp, the booster cell can in other embodiments be used to reduce resistance in paths between multiple clamps. For example, if additional clamps are placed between the I/O pad-1 of FIG. 6A and the power clamp 610, then the resistance between the two clamps can likewise be reduced using these techniques. The booster cell can also be used to reduce resistance in paths between back-to-back diodes. For instance, if a reverse diode is arranged in parallel with the steering diode 644 at the I/O pad-1 (as initially in FIG. 6B) but the reverse diode is placed at a more remote location from I/O pad-1 (e.g., at I/O pad-9), the booster cell can similarly reduce the resistance between the two diodes. In still another embodiment, the booster cell can be used to reduce the resistance between bump and clamp paths. For example, with reference to FIG. 6A, the resistance can be reduced between pad 642 and power clamp 610.

The modified ESD circuit as described herein can improve the effective resistance between the I/O pad and the ESD clamp. Further, these less resistive ESD discharge paths can be implemented without increasing the core area or the number of packaging pins in the IC. Further improvements are possible in the discharge path by increasing the number of booster cells.

While the ESD circuit as described herein includes the embodiments of the IC being at the edge of a die in the I/O region of the IC, the principles herein may be implemented in other areas of the IC. For example, the booster cell can be used within the core area, such as within the controller of an SOC or another type of IC. The discharge/booster cell can be used at the die edge or within the core area, for example, to prevent device breakdowns from excessive voltages by lowering resistance values without requiring additional clamps. Adding booster cells to reduce effective resistance can also minimize leakage currents since the use of additional clamps is generally unnecessary. Avoiding additional clamps also saves die area and eliminates the requirement to redesign I/O pads to include more metal layers, which may result in deviating from an existing standard or specification.

Further, as noted, addition of a clamp to facilitate ESD discharges requires an increase in the I/O pad width. The width of the booster cell conductor, by contrast, can fall within anywhere from a small fraction to a significant portion of, but less than, any I/O width. This technique is therefore flexible in that among numerous advantages, it does not increase overhead in the IC layout. The modified ESD circuit is also flexible with respect to the wire bond designs for the IC. For example, the use of the booster cell does not require additional package level pins. This technique is in contrast to adding new P/G pads, where new pins are required to carry the P/G signal to and from the pad.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) in the United States, or an analogous statute or rule of law in another jurisdiction, unless the element is expressly recited using the phrase "means for" or, in the case of a method claim, the element is recited using the phrase "step for."

What is claimed is:

1. An electrostatic discharge (ESD) circuit, comprising:
first and second rails configured to provide power to the ESD circuit, the first rail comprising two spaced apart conductors;
an input/output (I/O) pad;
a power/ground (P/G) pad comprising a power clamp electrically coupled between the first and second rails; and
a booster cell physically located between the I/O pad and the P/G pad, wherein the booster cell provides an electrical connection that directly couples the two spaced apart conductors, the electrical connection configured to short the two spaced apart conductors,
wherein the electrical connection provided by the booster cell comprises a plurality of parallel electrical connections stacked within the booster cell.

2. An electrostatic discharge (ESD) circuit, comprising:
first and second rails configured to provide power to the ESD circuit, the first rail comprising two spaced apart conductors;
a power/ground (P/G) pad having a width, wherein the P/G pad comprises a power clamp electrically coupled between the first and second rails; and
a booster cell providing an electrical connection that directly couples the two spaced apart conductors, the booster cell having a width less than the width of the P/G pad, the electrical connection configured to short the two spaced apart conductors,
wherein the electrical connection provided by the booster cell comprises a plurality of parallel electrical connections stacked within the booster cell.

* * * * *